United States Patent [19]

Itoh et al.

[11] Patent Number: 5,128,231
[45] Date of Patent: Jul. 7, 1992

[54] NEGATIVE PHOTORESIST COMPOSITION COMPRISING A PHOTOSENSITIZER OF A POLYHALOGEN COMPOUND

[75] Inventors: Toshio Itoh; Miwa Sakata; Yoshio Yamashita; Takateru Asano; Yuuzi Kosuga; Hiroshi Umehara, all of Tokyo, Japan

[73] Assignees: Oki Electric Industry Co., Ltd.; Fuji Chemicals Industrial Co., Ltd., both of Tokyo, Japan

[21] Appl. No.: 798,975

[22] Filed: Nov. 29, 1991

Related U.S. Application Data

[63] Continuation of Ser. No. 452,275, Dec. 18, 1989, abandoned.

[30] Foreign Application Priority Data

Dec. 23, 1988 [JP] Japan .................. 63-325386
Nov. 30, 1989 [JP] Japan .................. 1-311716

[51] Int. Cl.⁵ .............................. G03F 7/038
[52] U.S. Cl. .................... 430/270; 430/925; 430/919; 430/923; 430/905; 430/945; 522/2; 522/67; 522/45; 522/59; 522/63; 522/53; 522/150; 522/65
[58] Field of Search ............... 430/925, 919, 923, 905, 430/270; 522/67, 45, 59, 63, 53, 150, 65

[56] References Cited

U.S. PATENT DOCUMENTS

| | | | |
|---|---|---|---|
| 3,779,778 | 12/1973 | Smith et al. | 430/270 |
| 3,793,033 | 2/1974 | Mukherjee | 96/115 R |
| 4,789,619 | 12/1988 | Ruckert et al. | 430/270 |
| 4,840,867 | 6/1989 | Elsaesser et al. | 430/270 |
| 4,840,869 | 6/1989 | Kita et al. | 430/270 X |
| 5,034,304 | 7/1991 | Feely | 430/270 |

FOREIGN PATENT DOCUMENTS

| | | |
|---|---|---|
| 0040535 | 5/1981 | European Pat. Off. |
| 0232972 | 1/1987 | European Pat. Off. |
| 0319325 | 6/1989 | European Pat. Off. |

OTHER PUBLICATIONS

A. Bruns et al., Microelectronic Engineering 6(1987) 467–471.

Primary Examiner—Cynthia Hamilton
Attorney, Agent, or Firm—Wenderoth, Lind & Ponack

[57] ABSTRACT

A photoresist composition is disclosed. The photoresist composition comprises a base resin, a photosensitizer, and a solvent. The base resin comprises polyhydroxystyrene represented by the following structural formula (I):

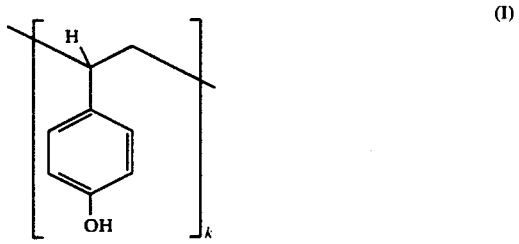

(wherein k is a positive integer). The photosensitizer comprises a polyhalogen compound(s). The photoresist composition of the present invention has dry etching resistance characteristics comparable to those of conventional positive novolak photoresist compositions and can form a resist pattern with a high resolution and vertical sidewall profiles. This makes microprocessing possible.

8 Claims, 2 Drawing Sheets

FIG_1 (a)

FIG_1 (b)

FIG_2

NEGATIVE PHOTORESIST COMPOSITION COMPRISING A PHOTOSENSITIZER OF A POLYHALOGEN COMPOUND

This application is a continuation of now abandoned application Ser. No. 07/452,275 filed on Dec. 18, 1989.

Background of the Invention

1. Field of the Invention

The present invention relates to a negative photoresist composition for use in the production of, for example, semiconductor devices.

2. Prior Art

Photoresist compositions (hereinafter often referred to simply as "resist") are basic materials for use in the photolithography step in the production of various semiconductor devices and the like.

As such resists, use has heretofore been made of, for example, cyclized rubber type compositions comprising an isoprene rubber as the base resin and a bisazide compound as the photosensitizer. As a dry etching technique capable of microprocessing in the order of at most 3 μm was developed in step with the ever-increasing scale of integration of semiconductor devices, however, an absolute necessity arose for a resist not only capable of forming fine resist patterns but also resistant to a reactive gas plasma generated during dry etching.

Positive acting novolak resists represented by, for example, "OFPR 800" (trade name of a product manufactured by Tokyo Ohka K.K.) are known as resists satisfying the above-mentioned requirements of fine resist pattern formation and dry etching resistance. Such positive resists comprise a cresol-formaldehyde resin [see the structural formula (1)] soluble in alkali developers as the base resin and a 2-diazonaphthoqinonesulfonic acid ester of polyhydroxybenzophenone [see the structural formulae (2) and (3])] as the photosensitizer.

(1)

[wherein in the structural formula (1), r is a positive integer.]

[wherein in the structural formulae (2) and (3), -DNQ stands for the following structural formula (a) or (b).]

(a)

(b)

In the case of these positive novolak resists, the mechanism of resist pattern formation is as follows.

In a positive resist prior to irradiation thereof with light, the photosensitizer [of the structural formula (2) or (3)] hardly soluble in an alkali developer dose not react with the base resin [of the structural formula (1)]soluble in the developer.

A reduction type projection exposure apparatus, wherein the g line (436 nm in wavelength) or the i line (365 nm in wavelength) from a mercury lamp is utilized, is generally used for exposure of such a positive resist to light. The above-mentioned photosensitizer, when irradiated with light through the above-mentioned exposure to light, is converted into a derivative of indenecarboxylic acid having polar carboxylic acid groups. Since this derivative of indenecarboxylic acid is so soluble in the alkali developer as to promote the dissolution of the light-irradiated (light-exposed) areas of the novolak resin, a positive resist pattern can be formed. In other words, pattern formation with this type of photoresist compositions is effected through an interaction of the photosensitizer capable of polarization upon exposure to light with the polar base resin.

The major reason for the use of the above-mentioned positive resist include the following.

(i) The use of the alkali developer substantially obviates swelling of the resist pattern while providing a resolution of about 1 to 2 μm.

(ii) The effect of stabilizing the resist against ion energy in the form of a reactive gas plasma or the like from the outside by resonance of many aromatic rings, such as skeletal benzene rings, included in the resist as shown in the structural formulae (1), (2) and (3) is great enough to provide excellent dry etching resistance characteristics as compared with the aforementioned cyclized rubber type resists.

(iii) The photosensitizer represented by the structural formula (21) or (3) are excellent in sensitivity within the range of exposure light wavelengths.

As the demand for a higher scale of integration of semiconductor devices has recently become increasingly strict, however, the fact is that a dimensional accuracy of the submicron order is required as to the fineness of resist patterns. As is well known, in projection type optical systems having the same number of apertures in an objective lens, the resolution of a resist pattern depends on the wavelength of exposure light in such a way that the shorter the wavelength, the higher the resolution is. In view of this, shortening the wave- length of light from a light source used in photorithographic techniques is under investigation.

A deep ultraviolet region ranging from 200 to 300 nm in wavelength of exposure light is presently utilized. Known short wavelength light sources include a xenon-mercury (Xe-Hg) lamp as already widely used and an excimer laser involving excitation of a mixed gas such as krypton-fluorine (Kr-F), which has recently been put into practical use.

In general, the aforementioned positive novolak resist supposed to be expose to light of the g line or the i line exhibits a large absorption within the deep ultraviolet region, assigned to aromatic ring moieties [see, for example, the structural formulae (1) to (3) and the structural formulae (a) and (b), and hardly undergoes decomposition of such aromatic ring moieties even when irradiated with light within the above-mentioned region. As a result, the amount of exposure to light is larger in the upper layer portion (portion closer to a light source) of a resist coating film than in the lower layer portion thereof. This results in formation of a resist pattern with a trapezoidal cross section in the case of a positive resist. On the other hand, in the case of a conventional common negative resist which exhibits a large absorption in the wavelength region of 200 to 300 nm, a resist pattern with a reverse trapezoidal cross section is obtained. Thus, in either case, a good resist pattern can hardly be formed.

As a technique of forming a good resist pattern is known, for example, a technique as disclosed in Literature I: "SPIE, vol. 631, Advances in Resist Technology and Processing III" (pp. 68 to 74, 1986).

In positive resists involved with this technique, a tert-butoxy-carbonyl derivative of styrene-maleimide copolymer represented by the structural formula (4):

[wherein s is a positive integer] is used as the base resin, while a 2-diazonaphtoquinone compound represented by the structural formula (5):

[wherein —DNQ stands for the aforementioned structural formula (a) or (b)] or diphenyliodonium trifluoromethanesulfonate represented by the structural formula (6):

is used as the photosensitizer.

The mechanism of formation of a resist pattern from a resist as disclosed in Literature I is as follows.

The base resin of the structural formula (4) is difficulty soluble in an alkali developer. When the above-mentioned resist is irradiated with deep ultraviolet radiation, the photosensitizer of the structural formula (5) or (6) is converted into an acidic substance. Through a catalytic interaction of the above-mentioned acidic substance with the base resin of the structural formula (4), the tert-butoxycarbonyl groups of the base resin are eliminated to form an imide compound. Since the resulting imide compound is soluble in the alkali developer, a positive resist pattern with a high resolution of about 1 μm can be obtained using that alkali developer.

The resist disclosed in the aforementioned Literature I are high in sensitivity since the foregoing reaction brought about by irradiation with deep ultraviolet radiation progresses in catalytic mode. Furthermore, the compound of the structural formula (4) as the base resin exhibits a reduced absorption within the deep ultraviolet region by virtue of maleimide units introduced thereinto as compared with the aforementioned compound of the structural formula (1). Accordingly, a resist pattern with a close-to-rectangular cross section can be obtained.

However, the conventional photoresist compositions comprising the compound of the aforementioned structural formula (4) as the base resin and the compound of the aforementioned structural formula (5) or (6) as the photosensitizer inevitably involve a problem of being lowered in resistance to etching with a reactive gas plasma as mentioned above because of introduction of maleimide units into the base resin with being lowered in the aromatic ring content as compared with novolak resists. Furthermore, where a substrate or the like as a base material is processed with a mask consisting of a resist pattern formed from a conventional negative resist as mentioned above the pattern cannot be transferred in the same dimensions as those of the mask to make microprocessing difficult.

In view of the above-mentioned problem of the prior art, an object of the present invention is to provide a deep ultraviolet sensitive photoresist composition excellent in resistance to etching with a reactive gas plasma and capable of forming a resist pattern with a close-to-rectangular cross section.

SUMMARY OF THE INVENTION

In order to attain the above-mentioned object, the present invention provides a photoresist composition comprising a base resin, a photosensitizer sensitive to deep ultraviolet radiation, and a solvent, wherein said base resin comprises a polyhydroxystyrene represented by the following structural formula (I):

(wherein k is a positive integer), and said photosensitizer comprises a polyhalogen compound(s).

In embodying the present invention, the weight-average molecular weight of the base resin of the structural formula (I) is preferably in the range of 1,000 to 100,000, more preferably in the range of 5,000 to 50,000. Such polyhydroxystyrene can be easily synthesized from a vinylphenol derivative through cationic polymerization, anionic polymerization or radical polymerization, as disclosed in Literature II: "Polymer", vol. 24, p. 995, 1983, published by Butterworth & Co. Ltd. Polyhydroxystyrene resins having a weight-average molecular weight of up to about 100,000 are available. Such polyhydroxystyrene resins have a glass transition point of about 170 °C. and absorption coefficient of about 0.25 $\mu m^{-1}$ and are alkali-soluble. The photoresist composition of the present invention forms a negative resist pattern. More specifically, polyhydroxystyrene as the base resin is reacted with halogen radicals generated by irradiating the photosensitizer with deep ultraviolet radiation to form a negative resist pattern, as will be described in detail later. This gives rise to a necessity for incorporation of a large amount of the photosensitizer into the composition to meet the stoichiometrical relationship between the base resin and the photosensitizer in the case where the polyhydroxystyrene has a small weight-average molecular weight. In order to enhance the sensitivity of the resist, therefore, the weight-average molecular weight of the base resin is preferably designed to be at least 1,000.

Polyhalogen compounds sensitive to at least one kind of radiation selected from among deep ultraviolet rays, X-rays, and electron beams are preferable as the photosensitizer to be contained in the photoresist composition of the present invention. Particularly preferred are polyhalogen compounds which generate halogen radicals when irradiated with deep ultraviolet radiation falling within the wavelength range of 200 to 300 nm. Such polyhalogen compounds having the above-mentioned properties include various types of compounds, main preferable examples of which include the following compounds: (a) dichloroalkanes and trichloroalkanes represented by the following general formula (II):

$$R^1-CH_{3-l}Cl_l \quad (II)$$

(wherein $R^1$ stands for an alkyl group; and l is 2 or 3, (b) polybromoalkanes and polyidoalkanes represented by the following general formula (III)

$$C_mH_{2m+2-n}X^1_n \quad (III)$$

(wherein $X^1$ stands for bromine or iodine, and m and n are integers, provided that they satisfy the formula:

$1 \leq n \leq 2m+2$).

(c) α-haloester compounds, α-halocarboxylic acid compounds, α-haloketone compounds, α-haloaldehyde compounds, α-haloamide compounds, N-alkylhaloamide compounds, and N,N-dialkylhaloamide compounds all represented by following general formula (IV):

$$CH_{3-p}X_p^2-\overset{\overset{\displaystyle O}{\|}}{C}-Y \quad (IV)$$

wherein $X^2$ stands for chlorine, bromine, or iodine; p is an integer of 1 to 3; and Y stands, for an alkoxyl group ($-OR^1$) in the case of the α-haloester compounds, for a hydroxyl group ($-OH$) in the case of the α-halocarboxyl acids, for an alkyl or aryl group ($-R^2$) in the case of the α-haloketone compounds, for hydrogen in the case of the α-haloaldehyde compounds, for an amino group ($-NH_2$) in the case of the α-haloamide compounds, for a primary amine residue ($-NHR^1$) in the case of the N-alkylhaloamide compounds, or for a secondary amine residue ($-N_2R^1$) in the case of N,N-dialkylhaloamide compounds]. (d) a range of compounds represented by the following general formula (V):

$$Ar-CH_{3-p}X^2_p)_q \quad (V)$$

(wherein p is an integer of 1 to 3; q is an integer of 1 or more; $x^2$ stands for chlorine, bromine, or iodine; and Ar stands for a phenyl group, a naphthyl group, a benzenesulfonyl group, an aminopyridine residue, an s-triazine residue, a furan residue, or a thiophene residue)

The polyhalogen compounds represented by one of the foregoing general formulae (II) to (V) are of a structure having halogen atoms with which at least two hydrogen atoms bonded to a carbon atom at the α-position of each corresponding unsubstituted compound have been substituted.

The alkyl group $R^1$ in the above-mentioned general formula (II) is preferably a primary alkyl such as methyl, ethyl or n-propyl; a secondary alkyl such as isopropyl, 2-butyl or 2-pentyl; or a tertiary alkyl such as 2-methyl-2-propyl or 2-ethyl-2-propyl.

The alkoxyl group Y in the α-haloester compounds of the general formula (IV) is preferably methoxy, ethoxy, isopropoxy, tert-butoxy, or phenoxy.

The alkyl group Y in the α-haloketone compounds of the general formula (IV) is preferably methy, ethyl, isopropyl, or tert-butyl, while the aryl group Y in the above-mentioned compounds is preferably phenyl, naphthyl, diphenyl, 4-pyridyl, p-chlorophenyl, or p-bromophenyl.

The primary amine residue Y in the N-alkylhaloamide compounds of the general formula (IV) is preferably methylamino, ethylamino or anilino.

The secondary amino residue Y in the N,N-dialkylhaloamide compounds of the general formula (IV) is preferably dimethylamino, diethylamino, or N-methylanilino.

As is well known, most of halogen compounds except for many fluoroalkyl compounds and simple monochloroalkyl compounds are capable of generating halogen radicals when irradiated with deep ultraviolet radiation. Here, taking alkyl halides having one carbon atom as an example, spectroscopic data will be mentioned. The maximum absorbance ($\lambda_{max}$) lies at 173 nm for $CH_3CL$, at 204 nm for $CH_3Br$ and at 258 nm for CH$_3$I, demonstrating that a halogen atom having a larger atomic weight shifts the site of $\lambda_{max}$ in UV absorption spectrum toward a longer wavelength. Likewise, the $\lambda_{max}$ lies at 258 nm for CH$_3$I, at 292 nm for CH$_2$I$_2$ and at 349 nm for CHI$_3$, demonstrating that a larger number of halogen atoms with which hydrogen atoms bonded to one carbon atom have been substituted shift the site of $\lambda_{max}$ in UV absorption spectrum toward a longer wavelength. Accordingly, in the case of substitution of one compound with a halogen atom(s), it is natural to guess that the larger the number of substituent halogen atoms and/or the larger the atomic weight of a substituent halogen atom(s), the higher the formation efficiency of halogen radicals should be. Further, the bond of a carbon atom to a halogen atom is easy of activation to form a halogen radical in the case where a carbonyl group or an aromatic substituent is present in a position adjacent to the above-mentioned carbon atom.

As will be understandable from the above, a wide variety of polyhalogen compounds, which are readily available, are utilizable in the present invention. Among those polyhalogen compounds, a compound having such suitable properties of being solid and/or low in self-decomposability at a baking temperature during drying of a resist coating film as to be adapted for use in a photoresist composition may be chosen according to the designing of the photoresist composition.

In embodying the present invention, the photosensitizer content of the photoresist composition of the present invention which content is based on the total amount of the photosensitizer and the base resin and represented by the following numerical formula:

$$\frac{\text{molar amount of photosensitizer}}{\text{molar amount of base resin} + \text{molar amount of photosensitizer}} \times 100 \text{ (mol \%)}$$

is preferably in the range of 1 mol % to 50 mol %, more preferably in the range of 2 mol % to 20 mol %, provided that the molar amount of the base resin is calculated based on monomer units and hence defined as a value obtained by dividing the weight of polyhydroxystyrene by the molecular weight of hydroxystyrene of 120 in the instant specification. The lower limit, 1 mol %, of the above-defined content is a minimum amount necessary for securing substantial sensitivity of the photoresist composition, while the upper limit, 50 mol %, of the above-defined content is a maximum amount allowable for securing sufficient adhesion of a resist to an object to be etched.

Also in embodying the present invention, a solvent to be contained in the photoresist composition is preferably at least one member selected from the group consisting of esters of acetic acid, ethers, lactones, and amides. Preferred esters of acetic acid include 2-methoxyetyl acetate and 2-ethoxyethyl acetate. Preferred ethers include dioxane and tetrahydrofuran. Preferred lactones include α-butyrolactone. Preferred amides include N,N-dimethylformamide and N,N-dimethylacetamide.

The photoresist composition of the present invention comprises polyhydroxystyrene represented by the aforementioned structural formula (I) and a polyhalogen compound represented by any one of the aforementioned general formulae (II) to (V). The mechanism of formation of a resist pattern from the above-mentioned photoresist composition is believed to be as follows.

The polyhalogen compound (generically represented by R-X) as the photosensitizer generates halogen radicals (represented by X$_\bullet$) when irradiated with deep ultraviolet radiation.

$$R\text{-}X \rightarrow R^\bullet + X^\bullet$$

The halogen radicals abstract hydrogen atoms from the benzyl positions of the polyhydroxystyrene to form polymer radicals. Subsequently, the polymer radicals crosslink therebetween to polymerize themselves. As a result, a negative resist pattern which is hard to dissolve in a developer (an organic solvent or an aqueous solution of an alkali) is obtained.

(wherein the formulae are drawn with a focus on hydroxystyrene units and one halogen radical).

Since formation of resist pattern is achieved with such halogen radicals, the photosensitizer content necessary for resist pattern formation can be decreased with no substantial decrease in the aromatic ring content of the whole photoresist composition. This is believed to contribute to an improvement in etching resistance characteristics.

BRIEF DESCRIPTION OF THE DRAWINGS

The foregoing and other objects and advantages of the present invention will be better understood by reference to the following description taken in connection with the accompanying drawings, in which.

DETAILED DESCRIPTION OF THE PREFERRED EMBODIMENTS

A detailed description will now be made of Examples according to the present invention. While specific conditions will be exemplified in the following Examples to facilitate the understanding of the present invention, it is to be understood that the following Examples should not be construed as limiting the scope of the present invention. Some of chemicals mentioned in the following Examples are not accompanied by mentioned of their origins. However, all of them used were chemically sufficiently pure and are readily available.

SENSITIVITY IN RESIST PATTERN FORMATION AND RESOLUTION OF RESIST PATTERN

Some photoresist compositions according to the present invention will be exemplified before a description of results of measurements of sensitivities of the photoresist composition comprising one of various polyhalogen compounds as the photosensitizer in actual resist pattern formation therefrom as well as resolutions of the resulting resist patterns.

EXAMPLES 1 TO 12

Resists 1 to 12 used in the measurements will first be described with centering on their compositions comprising a base resin and a photosensitizer with a photosensitizer content as defined hereinbefore.

In order to facilitate the comparison of the results of the measurements, one polyhydroxystyrene resin having a weight-average molecular weight of 18,800 was used as the base resin in combination with various photosensitizers to prepare various resists. The preparation of these resists was done throughout at room temperature.

Resist 1

90 mmol (11 g) of polyhydroxystyrene having a weight-average molecular weight of 18,800 was mixed with 10 mmol (1.62 g) of trichloroacetamide ($Cl_3CCONH_2$) as one of polyhalogen compounds of the type classified under the aforementioned general formula (IV). the resulting mixture was dissolved in 50 ml of 2-methoxyethyl acetate as a solvent. Thereafter, the resulting solution was filtrated through a porous membrane filter of 0.2 μm in pore size to obtain Resist 1. As will be understandable from the foregoing description, the trichloroacetamide content of the Resist 1 as defined hereinbefore was 10 mol %.

Resist 2

95 mmol of polyhydroxystyrene as mentioned before was mixed with 5 mmol (2.16 g) of tris(trichloromethyl)-s-triazine, which is one of polyhalogen compounds of the type classified under the aforementioned general formula (V) and is represented by the following structural formula (6):

(6)

The resulting mixture was dissolved in 50 ml of 2-methoxyethyl acetate as a solvent. Thereafter, the resulting solution was filtrated in the same manner as in the preparation of the Resist 1 to obtain Resist 2. The photosensitizer content of the Resist 2 was 5 mol %.

Resist 3

90 mmol of polyhydroxystyrene as mentioned before was mixed with 10 mmol (2.65 g) of 2,4-dichlorobenzotrichloride, which is one of polyhalogen compounds of the type classified under the aforementioned general formula (V) and is represented by the following structural formula (7):

(7)

The resulting mixture was dissolved in 50 ml of 2-methoxyethyl acetate as a solvent. Thereafter, the resulting solution was filtrated in the same manner as in the preparation of the Resist 1 to obtain Resist 3. The photosensitizer content of the Resist 3 was 10 mol %.

Resist 4

90 mmol of polyhydroxystyrene as mentioned before was mixed with 10 mmol of dichloroacetamide ($Cl_2CHCONH_2$) as one of the polyhalogen compounds of the type classified under the aforementioned general formula (IV). The resulting mixture was dissolved in 50 ml of 2-methoxyethyl acetate as a solvent. Thereafter, the resulting solution was filtrated in the same manner as in the preparation of the Resist 1 to obtain Resist 4. The photosensitizer content of the Resist 4 was 10 mol %.

Resist 5

90 mmol of polyhydroxystyrene as mentioned before was mixed with 10 mmol of tribromoquinaldine, which is one of polyhalogen compounds of the type classified under the aforementioned general formula (V) and is represented by the following structural formula (8);

(8)

The resulting mixture was dissolved in 50 ml of 2-methoxyethyl acetate as a solvent. Thereafter, the resulting solution was filtrated in the same manner as in the preparation of the Resist 1 to obtain Resist 5. The photosensitizer content of the Resist 5 was 10 mol %.

Resist 6

Resist 6 was prepared using substantially the same procedure as in the preparation of the Resist 3 except that 2,4-dichlorobenzotrichloride as mentioned before [structural formula (7)] was used in such an amount as to provide a photosensitizer content of 5 mol %.

Resist 7

Resist 7 was prepared using substantially the same procedure as in the preparation of the Resist 2 except that tris(trichloromethyl)-s-triazine as mentioned before [structural formula (6)] was used in such an amount as to provide a photosensitizer content of 10 mol %.

Resist 8

90 mmol of polyhydroxystyrene as mentioned before was mixed with 10 mmol of tribromomethyl phenyl sulfone, which is one of polyhalogen compounds of the type classified under the aforementioned general formula (V) and is represented by the following structural formula (9);

(9)

The resulting mixture was dissolved in 50 ml of 2-methoxyethyl acetate as a solvent. Thereafter, the resulting solution was filtrated in the same manner as in the preparation of the Resist 1 to obtain Resist 8. The photosensitizer content of the Resist 8 was 10 mol %.

Resist 9

Resist 9 was prepared using substantially the same procedure as in the preparation of the Resist 8 except that tribromomethyl phenyl sulfone as mentioned before [structural formula (9)] was used in such an amount as to provide a photosensitizer content of 5 mol %.

Resist 10

90 mmol of polyhydroxystyrene as mentioned before was mixed with 10 mmol of carbon tetrabromide ($CBR_4$) as one of the polyhalogen compounds of the type represented by the aforementioned general formula (III) in the presence of 10 mmol of dimethylaminopyridine. The resulting mixture was dissolved in 50 ml of 2-methoxyethyl acetate as a solvent. Thereafter, the resulting solution was filtrated in the same manner as in the preparation of the Resist 1 to obtain Resist 10. The photosensitizer content of the Resist 10 was 10 mol %. The dimethylaminopyridine contained in the Resist 10 serves to promote the generation of halogen radicals from carbon tetrabromide as is well known.

Resist 11

90 mmol of polyhydroxystyrene as mentioned before was mixed with 10 mmol of p-bromophenancyl bromide, which is one of polyhalogen compounds of the type classified under the aforementioned general formula (IV) and is represented by the following structural formula (10);

(10)

The resulting mixture was dissolved in 50 ml of 2-methoxyethyl acetate as a solvent. Thereafter, the resulting solution was filtrated in the same manner as in the preparation of the Resist 1 to obtain Resist 11. The photosensitizer content of the Resist 11 was 10 mol %.

Resist 12

Resist 12 was prepared using substantially the same procedure as in the preparation of the Resist 4 except that a mixed solvent composed of 2-methoxyethyl acetate and isoamyl acetate at a weight ratio of 1:9 was used instead of 2-methoxyethyl acetate alone. The photosensitizer (dichloroacetamide) content of the Resist 12 was 10 mol %.

The procedure of forming a resist pattern using each of the foregoing Resists 1 to 12 will be described while referring to FIGS. 1(a) and (b).

Figure 1A:
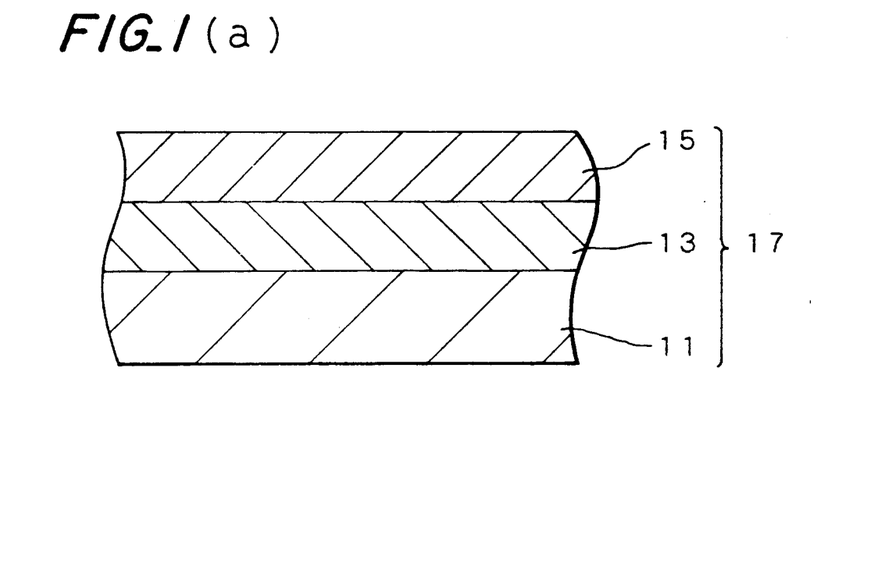
FIGS. 1(a) and (b) are schematic cross-sectional views of an intermediate structure and a structure with a resist pattern, respectively, produced in the course of a process for forming a resist pattern on a substrate, which are illustrative of examples of the photoresist composition of the present invention.
Figure 1B:
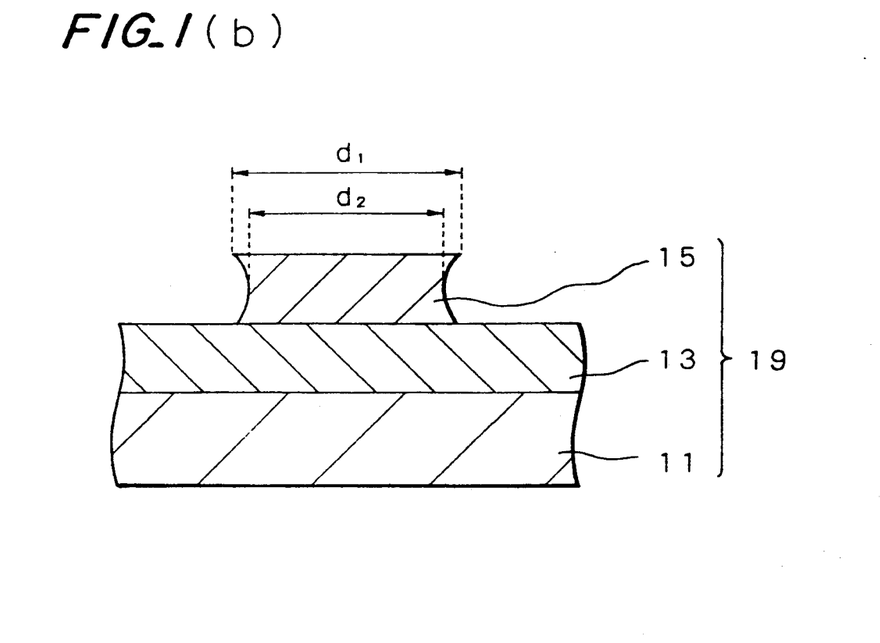

FIGS. 1(a) and 1(b) are schematic cross-sectional illustrations of an intermediate structure and a structure with a resist pattern produced in the course of a process for forming a resist pattern, by reference to which illustrations a description will be made of the procedure of the measurements of sensitivity and resolution in the following Examples. In the figures, hatching indicative of cross section was partially omitted.

As shown in FIG. 1(a), a reflection preventive layer 13 of 1 μm in thickness from which photosensitivity was eliminated through thermal cure was formed on the upper surface of a silicon substrate 11 as an object to be etched. Additionally stated, the reflection preventive layer was provided for accommodation to comparison in sensitivity, and hence is different from such a reflection preventive layer as used in a photolithographic process for producing a device. Any material can be used to form the above-mentioned reflection preventive layer in so far as it can completely absorb light which was passed through a resist.

In the Examples, a photoresist "MP 2400" (trade name of a product manufactured by Shipley) was used as the material of the reflection preventive layer 13 since it is easy of thermal cure.

Subsequently, each of the solutions of the Resists 1 to 12 was applied on the surface of the above-mentioned reflection preventive layer 13 by spin coating, soft-baked using a hot plate at a temperature of 100 ° C. for 1 minute to form a resist layer 15 of 1 μm in thickness. Thus, a structure 17 to be exposed to deep ultraviolet radiation was obtained.

The above-mentioned reflection preventive layer 13 was supposed to prevent deep ultraviolet radiation once transmitted through the resist layer 15 upon irradiation therewith of the structure 17 from being reflected to enter the resist layer 15.

The structure 17 of FIG. 1(a) thus obtained was irradiated with deep ultraviolet radiation emitted from a Xe-Hg lamp (an aligner PLA 501 equipped with a cold mirror CM 250, manufacture by Canon Inc., wavelengths: 220 to 300 nm) while using a quartz mask in close contact with the resist layer 15.

Thereafter, the irradiated structure 17 was subjected to development with an alkali developer "MF 312" (trade name of product manufactured by Shipley), diluted four-fold by volume with pure water and maintained at a temperature of 23° C., for a predetermined period of time, and was then rinsed with pure water for 30 seconds to obtain a measurement sample 19 having a negative resist pattern as shown in FIG. 1(b).

Subsequently, the cross-section of the sample thus obtained was observed with an electron microscope to measure the dimension $d_1$ of the uppermost portion of the pattern and the dimension $d_2$ of the minimum-sized portion of the pattern as shown in FIG. 1(b), from which the amount of overhang as defined by a formula: $(d_1-d_2)/2$ was calculated.

In a repetition of the foregoing resist pattern formation, the resolvable dimension of pattern just before the dimension $d_2$ gets a value of substantial zero is referred to as "minimum resolvable dimension".

Attached Table 1 shows the results of measurements of sensitivity in terms of minimum dosage of deep ultraviolet radiation necessary for securing a given rate of a residual film remaining after development as well as minimum resolvable dimension and amount of overhang with respect to the aforementioned Resists 1 to 12 under Examples 1 to 12, respectively.

As can be understood from attached Table 1, the Resists 1, 2, 4, 7 and 12 used in Examples 1, 2, 4, 7 and 12 used in Examples 1, 2, 4, 7 and 12 provided an amount of overhang of 0 μm with a rectangular cross section of a resist pattern even when the minimum disolvable dimension was 0.5 μm. The Resists 3, 6 and 9 to 11 used in Examples 3, 6, and 9 to 11 provided a minimum resolvable dimension of 0.5 μm and an amount of overhang of 0.1 μm (in Example 9) or smaller to form a resist pattern with a high resolution. It also can be understood that the Resists 5 and 8 used in Examples 5 and 8 provided a minimum resolvable dimension of 1.0 μm and of 0.2 μm or smaller.

It can further understood from the results as dosage that the resists wherein the photosensitizer used was tris(trichloromethyl)-s-triazine (Examples 2 and 7), 2,4-dichlorobenzotrichloride (Examples 3 and 6), tribromomethyl phenyl sulfone (Examples 8 and 9), carbon tetrabromide in the presence of dimethylaminopyridine (Example 10), or p-bromophenancyl bromide (Example 11) exhibited a comparatively excellent sensitivity.

EXAMPLES 13 to 18

In the following Examples, two series of resists differing in the weight-average molecular weight of polyhydroxystyrene used therein were prepared, and resist patterns were formed from the resists to give results of the measurements, which will be described later while referring to Attached Table 2.

A description will first be made of Resists 13 to 18 used in the measurements in Examples 13 to 18.

Resist 13

Resist 13 was prepared using 5 mmol of tris(trichloromethyl)-s-triazine as the photosensitizer and 50 ml of 2-methoxyethyl acetate as the solvent in substantially the same manner as in the preparation of the Resist 2 except that 95 mmol of polyhydroxystyrene having a weight-average molecular weight of 48,800 was used.

Resist 14

Resist 14 was prepared using 5 mmol of tris(trichloromethyl)-s-triazine as the photosensitizer and 50 ml of 2-methoxyethyl acetate as the solvent in substantially the same manner as in the preparation of the Resist 2 except that 95 mmol of polyhydroxystyrene having a weight-average molecular weight of 5,000 was used.

Resist 15

Resist 15 was prepared using 5 mmol of tris(trichloromethyl)-s-triazine as the photosensitizer and 50 ml of 2-methoxyethyl acetate as the solvent in substantially the same manner as in the preparation of the Resist 2 except that 95 mmol of polyhydroxystyrene having a weight-average molecular weight of 1,600 was used.

Resist 16

Resist 16 was prepared using 10 mmol of 2,4-dichlorobenzotrichloride as the photosensitizer and 50 ml of 2-methoxyethyl acetate as the solvent in substantially the same manner as in the preparation of the Resist 3 except that 90 mmol of polyhydroxystyrene having a weight-average molecular weight of 48,800 was used.

Resist 17

Resist 17 was prepared using 10 mmol of 2,4-dichlorobenzotrichloride as the photosensitizer and 50 ml of 2-methoxyethyl acetate as the solvent in substantially the same manner as in the preparation of the Resist 3 except that 90 mmol of polyhydroxystyrene having a weight-average molecular weight of 5,000 was used.

Resist 18

Resist 18 was prepared using 10 mmol of 2,4-dichlorobenzotrichloride as the photosensitizer and 50 ml of 2-methoxyethyl acetate as the solvent in substantially the same manner as in the preparation of the Resist 3 except that 90 mmol of polyhydroxystyrene having a weight-average molecular weight of 1,600 was used.

The Resists 13 to 18 were each used to form a resist pattern according to the same procedure as in Examples 1 to 12 already described while referring to FIGS. 1(a) and (b).

As will be understandable from Attached Table 2, there is tendency that a larger dosage of deep ultraviolet radiation is required as the weight-average molecular weight of polyhydroxystyrene used as the base resin in combination with the same photosensitizer is smaller. This is believed to be affected by the absorption coefficient of polyhydroxystyrene as mentioned in Table 1.

TABLE 1

| Weight-Average Molecular Weight of Polyhydroxystyrene | Absorption Coefficient (μm$^{-1}$) |
| --- | --- |
| 48,800 | 0.29 |
| 18,800 | 0.70 |
| 5,000 | 0.52 |
| 1,600 | 0.79 |

EXAMPLES 19 to 26

A description will now be made of Examples wherein a krF excimer laser was used as a light source in place of the Xe-Hg lamp in the course of resist pattern formation.

Figure 2:
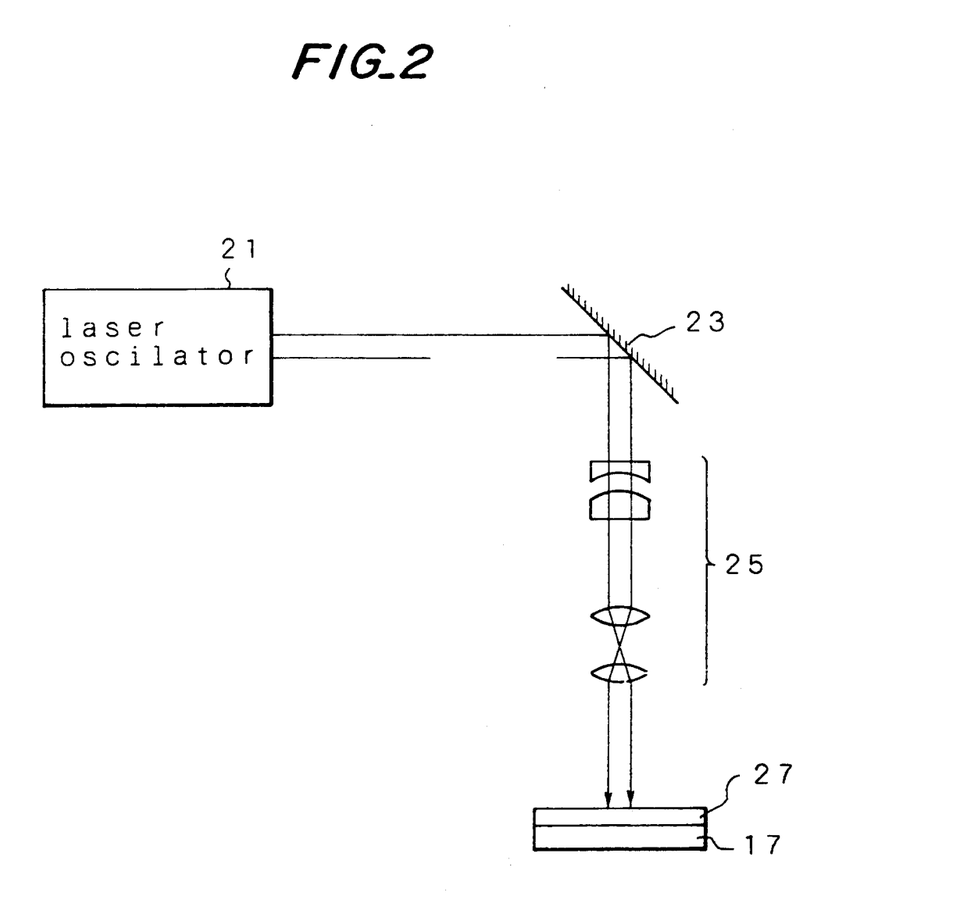
FIG. 2 is a schematic illustration of the structure of an exposure apparatus, which was used in Examples according to the present invention.

The excimer laser used in these Examples was of an optical system as illustrated in FIG. 2.

As shown in FIG. 2, deep ultraviolet radiation (wavelength: about 250 nm) emitted from laser oscillator 21 (manufactured by Lambda Physics) is guided to lens system 25 by means of a reflective mirror 23. A structure 17 [see FIG.1(a)] in close contact with a mask 27 is irradiated with a laser beam which has passed through the lens system 25. In the Examples, the structure 17 with the same thickness of layers as in Examples 1 to 18 was irradiated with a laser beam pulse energy of 4.1 mJ/cm$^2$ and subjected to development under the same conditions as in Examples 13 to 18.

Resists used in the Examples and results of measurements obtained therein will be described while referring to Attached Table 3.

In Examples 19 to 22, tris(trichloromethyl)-s-triazine was used as a photosensitizer to prepare resists differing only in the weight-average molecular weight of polyhydroxystyrene. More specifically, the resist used in Example 19 corresponds to the aforementioned Resist 13, the resist used in Example 20 to the aforementioned Resist 2, and the resists used in Examples 21 and 22 to the aforementioned Resists 14 and 15, respectively.

As will be understandable from the resist of measurements in Examples 19 to 22, a minimum resolvable dimension of at most 0.5 μm can be attained by irradiation using the excimer laser, and there is a tendency that a larger dosage is required as the weight-average molecular weight of polyhydroxystyrene is smaller, just as described in Examples 13 to 15.

In Examples 23 to 26, 2,4-dichlorobenzotrichloride was used as a photosensitizer to prepare resists differing only in the weight-average molecular weight of polyhydroxystyrene, which were used to form resist patterns with results of measurements as shown in Attached Table 3. The resist used in Example 23 corresponds to the aforementioned Resist 16, the resist used in Example 24 to the aforementioned Resist 3, and the resists used in Examples 25 and 26 to the aforementioned Resists 17 and 18, respectively.

As will be understandable from the results of measurements in Examples 23 to 26 as well, a minimum resolvable dimension of at most 0.5 μm can be attained by irradiation using the excimer laser, and there is a tendency that a larger dosage is required as the weight-average molecular weight of polyhydroxystyrene is smaller.

COMPARISON EXAMPLE 1

The same reflection preventive layer as formed in the foregoing Examples was formed on the same substrate as used in the foregoing Examples. Thereafter, a negative resist layer was formed on the reflection preventive layer. As the negative resist, use was made of "Laycast RD-2000N" (trade name of a negative resist containing a bisazide as the photosensitizer and polyhydroxystyrere, manufactured by Hitachi Chemical Co., Ltd.). The above-mentioned negative resist layer having a thickness of 1 μm was formed by applying the above-mentioned negative resist on the above-mentioned reflection preventive layer according to spin coating at 5,000 r.p.m. and baking the resulting resist coating film using a hot plate at a temperature of 80° C. for 1 minute. The resulting structure in close contact with a mask was irradiated with deep ultraviolet radiation emitted from a Xe-Hg lamp (equipped with a cold mirror CM 250) for 2 seconds, subjected to development with a developer RD (trade name of product manufactured by Hitachi Chemical Co.,Ltd.) for 90 seconds, and rinsed with pure water for 60 seconds. The resulting structure was postbaked using a hot plate at a temperature of 140 ° C. for 1 minute to obtain a resist pattern.

The cross section of the obtained resist pattern was observed to find out that the amount of overhang in the pattern of 1 μm lines and spaces was 0.4 μm. This result is listed under Comparison Example 1 in Attached Table 4.

The foregoing description has been made of Resists 1 to 26 exemplified as photoresist compositions according to the present invention and the resolutions of the resist patterns formed therefrom in Examples 1 to 26. Conventional deep ultraviolet sensitive positive photoresist compositions are hard to compare with the negative Resists 1 to 26 used in the foregoing Examples. According to the aforementioned Literature 1, however, it is believed that the resists according to the present invention are comparable in sensitivity inferred from dosage to the conventional positive photoresist compositions, and are higher in resolution in terms of minimum resolvable dimension than the conventional positive photoresist compositions.

As is apparent from a comparison of Examples with Comparison Example 1, the negative photoresist composition of the present invention is higher in not only sensitivity but also resolution than the conventional negative photoresist composition in view of the fact that the amounts of overhang in the Examples were at most about 1/10 of that in Comparison Example 1.

EXAMPLES 27 to 28

A description will now be made of dry etching resistance characteristics as measured using a sample prepared by applying a resist on the surface of a silicon substrate, drying the resulting resist coating film to form a resist layer of 1 μm in thickness and developing the resist layer to form a resist pattern of 1 μm lines and spaces.

EXAMPLE 27

In Example 27, a sample as mentioned above was prepared using the aforementioned Resist 3, and subjected to a dry etching treatment effected in a mixed gas of oxygen-carbon tetrafluoride (containing 10 vol. % of oxygen) with a parallel plate type dry etching apparatus "DEM 451" (manufactured by ANELVA Corporation) to examine the dry etching resistance characteristics of resist pattern of 1 μm lines and spaces. The pressure of the mixed gas was 2 Pa and the gas flow rate was 50 sccm, while power density was $0.12W/cm^2$.

The thickness of the resist pattern of the sample was measured with "Tally Step" (trade name of a product manufactured by Tailor Hobson) before and after the dry etching treatment. The etching rate was calculated from the amount of a decrease in the thickness of the resist pattern for an etching time of 10 minutes. As a result, it was found that the resist pattern formed in Example 27 was etched at a rate of 7.9 nm/min, while the amount of dimensional decrease in the width of the lines of the resist pattern was 50 nm. These results are listed in Attached Table 5.

EXAMPLE 28

In Example 28, the same sample as in Example 27 was prepared and subjected to a dry etching treatment with the same apparatus as used in Example 27 using effected with the same apparatus as used in Example 27 using carbon tetrachloride gas instead of the mixed gas of oxygen-carbon tetrafluoride used in Example 27. The gas pressure was 10 Pa and the gas flow rate was 20 sccm, while the power density was $0.16W/cm^2$.

As a result, it was found out that the resist pattern was etched at a rate of 11.0 nm/min in Example 28.

COMPARISON EXAMPLES 2 AND 3

For comparison, samples of Comparison Examples 2 and 3 were prepared using as resists a tert-butoxycarbonyl derivative of styrene-maleimide copolymer (1:1 copolymer, weight-average molecular weight: 6,500) as disclosed in the aforementioned Literature I and the aforementioned "OFPR 800", respectively. Each sample was subjected to a dry etching treatment under the same conditions as in Example 27 to examine the dry etching resistance characteristics of a resist pattern of 1 μm lines and spaces. The etching rate and the amount of a dimensional decrease in the width of lines of the resist pattern were measured in the same manner as in Example 27.

As a result, it was found that the resist patterns of the samples of Comparison Examples 2 and 3 were etched at rates of 10.1 nm/min and 7.7 nm/min, respectively, as compared with the etching rate of 7.9 nm/min in Example 27 as already mentioned, while the amount of a dimensional decrease in the width of the lines was 300 nm in Comparison Example 2 and 200 nm in Comparison Example 3. These results are also listed in Attached Table 5.

As can be seen from the foregoing results, the resist pattern of the sample of Example 27 which was formed from the photoresist composition comprising polyhydroxystyrene according to the present invention is superior in etching resistance characteristics to the resist pattern formed from the conventional deep ultraviolet sensitive resist (Comparison Example 2), and substantially comparable in etching resistance characteristics to the resist pattern formed from the novolak resist (comparison Example 3).

Contrary to Example 28, the resist patterns of the same samples as in Comparison Examples 2 and 3 were etched at rates of 16.0 nm/min and 10.0 nm/min, respectively.

As can be understood from the foregoing results, even in the case of a dry etching system using carbon tetrachloride, the resist pattern of the same sample of Example 27 which was formed from the photoresist composition according to the present invention is superior in etching resistance characteristics to the resist pattern formed from the conventional deep ultraviolet sensitive resist (Comparison Example 2), and substantially comparable in etching resistance characteristics to the resist pattern formed from the novolak resist (Comparison Example 3).

As described heretofore with exemplification of Examples 1 to 28, the photoresist composition of the present invention has a resolution comparable or superior to conventional deep ultraviolet sensitive photoresist compositions as well as etching resistance characteristics comparable to conventional novolak photoresist compositions.

While the present invention has been described with reference to the Examples, it will be obvious to those skilled in the art that the present invention is not ineffective unless it is restricted to the foregoing Examples.

For example, the resolution of the photoresist composition of the present invention can be improved by using therein polyhydroxystyrene reduced by means of catalytic reduction or hydride to decrease deep ultraviolet absorption thereof because the phenolic hydroxyl groups [see the structural formula (1)] of polyhydroxystyrene, which is readily available on the market, are generally easy of oxidation to occasionally make the photoresist composition liable to greatly absorb deep ultraviolet radiation.

When the photoresist composition of the present invention is to be stored in a state of being dissolved in a solvent, the use of an acetate solvent as used in the foregoing Examples, an ether solvent such as dioxane or tetrahydrofuran, a lactone solvent such as $\gamma$-butyrolactone, or an amide solvent such as N,N-dimethylformamide, N-methylpyrrolidone or hexamethylphosphoric triamide can keep the base resin and/or the photosensitizer from precipitating and permits the photoresist composition to be applied in uniform thickness.

While the specific polyhalogen compounds have been exemplified in the foregoing Examples, photosensitizers usable in the present invention are not limited to only those exemplified substances. Any photosensitizer can provide the same effects as in the foregoing Examples in so far as it can generate halogen radicals when irradiated with deep ultraviolet radiation.

While the foregoing description is concerned with a case where the photoresist composition of the present invention is irradiated with deep ultraviolet radiation, electron beams or X-ray may be used in place of deep ultraviolet radiation. Since a polyhalogen compound undergoes photolysis when irradiated with deep ultraviolet radiation, it is natural to guess that the polyhalogen compound should undergo sufficient photolysis when irradiated with accelerated electron beams, X-rays or other radiation, which is higher in energy than deep ultraviolet radiation. Accordingly, the photoresist composition of the present invention is also usable as an electron beam sensitive resist and an X-ray sensitive resist.

It will be obvious to those skilled in the art that the foregoing materials and numerical and other conditions are capable of arbitrary and suitable alternation and modification in design within the purview of the object of the present invention.

As is apparent from the foregoing Examples, the photoresist composition of the present invention comprising at least a combination of polyhydroxystyrene as the base resin with a polyhalogen compound as the photosensitizer is not lowered in the content of aromatic rings attributed to the base resin, unlike a photoresist composition comprising a base resin having maleimide units introduced thereinto. Therefore, the photoresist composition of the present invention is not spoiled in etching resistance characteristics and can form a resist pattern with a high resolution through the pattern formation mechanism wherein halogen radicals are utilized.

Thus, photoresist composition of the present invention has dry etching resistance characteristics comparable to those of conventional positive novolak photoresist compositions and can form a resist pattern with vertical sidewall profiles. Accordingly, processing of a base material with such a resist pattern as the mask can accurately transfer the pattern of the mask to the base material. This makes microprocessing possible.

Attached TABLE 1

|  | Kind of Photosensitizer | Photosensitizer content (mol %) | Development[*1] Time (sec) | Dosage (mJ/cm$^2$) | Minimum Resolvable Dimension ($\mu$m) | Amount of Overhang ($\mu$m) |
|---|---|---|---|---|---|---|
| Ex. 1 | trichloroacetamide | 10 | 80 | 350 | 0.5 | 0 |
| Ex. 2 | tris(trichloromethyl)-s-triazine | 5 | 60 | 100 | 0.5 | 0 |
| Ex. 3 | 2,4-dichlorobenzotrichloride | 10 | 110 | 200 | 0.5 | 0.05 |
| Ex. 4 | dichloroacetamide | 10 | 80 | 400 | 0.5 | 0 |
| Ex. 5 | tribromoquinaldine | 10 | 160 | 600 | 1.0 | 0.2 |

Attached TABLE 1-continued

| | Kind of Photosensitizer | Photosensitizer content (mol %) | Development[*1] Time (sec) | Dosage (mJ/cm$^2$) | Minimum Resolvable Dimension (μm) | Amount of Overhang (μm) |
|---|---|---|---|---|---|---|
| Ex. 6 | 2,4-dichlorobenzo-trichloride | 5 | 110 | 140 | 0.5 | 0.02 |
| Ex. 7 | tris(trichloromethyl)-s-triazine | 10 | 70 | 100 | 0.5 | 0 |
| Ex. 8 | tribromomethyl phenyl sulfone | 10 | 170 | 200 | 1.0 | 0.15 |
| Ex. 9 | tribromomethyl phenyl sulfone | 5 | 170 | 160 | 0.5 | 0.1 |
| Ex. 10 | carbon tetrabromide (in the presence of dimethylaminopyridine) | 10 | 150 | 100 | 0.5 | 0.05 |
| Ex. 11 | p-bromophenancyl bromide | 10 | 120 | 100 | 0.5 | 0.02 |
| Ex. 12 | dichloroacetamide | 10 | 50 | 400 | 0.5 | 0 |

[*1] A 1:3 mixture of "MF 312" and water was used as the developer.

Attached TABLE 2

| | Weight-Average Molecular Weight of Polyhydroxystyrene | Kind of Photosensitizer | Photosensitizer Content (mol %) | Development Time (sec) | Dosage (mJ/cm$^2$) | Minimum Resolvable Dimension (μm) | Amount of Overhang (μm) |
|---|---|---|---|---|---|---|---|
| Ex. 13 | 48,800 | tris(trichloromethyl)-s-triazine | 5 | 90[*1] | 50 | 0.5 | 0 |
| Ex. 14 | 5,000 | tris(trichloromethyl)-s-triazine | 5 | 30[*1] | 250 | 0.4 | 0 |
| Ex. 15 | 1,600 | tris(trichloromethyl)-s-triazine | 5 | 30[*2] | 600 | 0.35 | 0 |
| Ex. 16 | 48,800 | 2,4-dichlorobenzo-trichloride | 10 | 130[*1] | 100 | 0.5 | 0.05 |
| Ex. 17 | 5,000 | 2,4-dichlorobenzo-trichloride | 10 | 80[*1] | 350 | 0.5 | 0 |
| Ex. 18 | 1,600 | 2,4-dichlorobenzo-trichloride | 10 | 30[*2] | 700 | 0.4 | 0 |

[*1] A 1:3 mixture of "MF 312" and water was used as the developer.
[*2] A 1:4 mixture of "MF 312" and water was used as the developer.

Attached TABLE 3

| | Weight-Average Molecular Weight of Polyhydroxystyrene | Kind of Photosensitizer | Photosensitizer Content (mol %) | Development Time (sec) | Dosage (mJ/cm$^2$) | Minimum Resolvable Dimension (μm) | Amount of Overhang (μm) |
|---|---|---|---|---|---|---|---|
| Ex. 19 | 48,800 | tris(trichloromethyl)-s-triazine | 5 | 90[*1] | 349 | 0.5 | 0 |
| Ex. 20 | 18,800 | tris(trichloromethyl)-s-triazine | 5 | 70[*1] | 246 | 0.4 | 0 |
| Ex. 21 | 5,000 | tris(trichloromethyl)-s-triazine | 5 | 30[*1] | 898 | 0.4 | 0 |
| Ex. 22 | 1,600 | tris(trichloromethyl)-s-triazine | 5 | 30[*2] | 1098 | 0.4 | 0 |
| Ex. 23 | 48,800 | 2,4-dichlorobenzo-trichloride | 10 | 130[*1] | 107 | 0.5 | 0.02 |
| Ex. 24 | 18,800 | 2,5-dichlorobenzo-trichloride | 10 | 110[*1] | 176 | 0.4 | 0 |
| Ex. 25 | 5,000 | 2,4-dichlorobenzo-trichloride | 10 | 80[*1] | 690 | 0.35 | 0 |
| Ex. 26 | 1,600 | 2,4-dichlorobenzo-trichloride | 10 | 30[*2] | 1025 | 0.35 | 0 |

[*1] A 1:3 mixture of "MF 312" and water was used as the developer.
[*2] A 1:4 mixture of "MF 312" and water was used as the developer.

Attached TABLE 4

| | Kind of Resist | Light Source | Dosage (mJ/cm$^2$) | Developer | Development Time (sec) | Amount of Overhang ($\mu$m) |
|---|---|---|---|---|---|---|
| Comp. Ex. 1 | negative resist (Laycast RD-2000N) | Xe—Hg lamp | 80 | developer RD | 90 | 0.4 |

Attached TABLE 5

| | Kind of Resist | Etching Rate (nm/min) | Dimensional Decrease in Width of Line of Resist Pattern (nm) |
|---|---|---|---|
| Ex. 27 | Resist 3 as used in Ex. 3 | 7.9 | 50 |
| Comp. Ex. 2 | resist as mentioned in Literature 1 | 10.1 | 300 |
| Comp. Ex. 3 | OFPR 800 (manufactured by Tokyo Ohka K.K.) | 7.7 | 200 |

What is claimed is:

1. A negative photoresist composition consisting essentially of:
a base resin,
a photosensitizer, and
a solvent;
said base resin comprising a polyhydroxystyrene represented by the following structural formula (I):

(I)

wherein k is a positive integer; and
said photosensitizer comprising a polyhalogen compound(s).

2. A negative photoresist composition as claimed in claim 1, wherein said base resin has a weight-average molecular weight of 1,000 to 100,000.

3. A negative photoresist composition as claimed in claim 1, wherein said photosensitizer is sensitive to at least one member selected from the group consisting of deep ultraviolet radiation, X-rays, and electron beams.

4. A negative photoresist composition as claimed in claim 1, wherein said photosensitizer comprises at least one polyhalogen compound selected from the group consisting of dichloroalkanes and trichloroalkanes represented by the following general formula (II):

$$R^1-CH_{3-l}Cl_l \quad (II)$$

wherein $R^1$ stands for an alkyl group; and l is 2 or 3, and polybromoalkanes and polyiodoalkanes represented by the following general formula (III):

$$C_mH_{2m+2-n}X^1_n \quad (III)$$

wherein $X^1$ stands for bromine or iodine; and m and n are integers, provided that they satisfy the formula: $1 \leq n \leq 2m+2$.

5. A negative photoresist composition as claimed in claim 1, wherein said photosensitizer comprises at least one polyhalogen compound selected from the group consisting of $\alpha$-haloester compounds, $\alpha$-halocarboxylic acid compounds, $\alpha$-haloketone compounds, $\alpha$-haloaldehyde compounds, $\alpha$-haloamide compounds, N-alkylhaloamide compounds, and N,N-dialkylhaloamide compounds all represented by the following general formula (IV):

$$CH_{3-p}X^2_p-\overset{O}{\underset{\|}{C}}-Y \quad (IV)$$

wherein $X^2$ stands for chlorine, bromine, or iodine; p is an integer of 1 to 3; and Y stands for an alkoxyl group ($-OR^1$) in the case of said $\alpha$-haloester compounds, for a hydroxyl group ($-OH$) in the case of said $\alpha$-halocarboxylic acids, for an alkyl or aryl group ($-R^2$) in the case of the $\alpha$-haloketone compounds, for hydrogen in the case of said $\alpha$-haloaldehyde compounds, for an amino group ($-NH_2$) in the case of said $\alpha$-haloamide compounds, for a primary amine residue ($-NHR^1$) in the case of said N-alkylhaloamide compounds, or for a secondary amine residue ($-N_2R^1$) in the case of N,N-dialkylhaloamide compounds.

6. A negative photoresist composition as claimed in claim 1, herein said photosensitizer comprises at least one polyhalogen compound selected from the group consisting of compounds represented by the following general formula (V):

$$Ar-CH_{3-p}X^2_p)_q \quad (V)$$

wherein p is an integer of 1 to 3; q is an integer of 1 or more; $x^2$ stands for chlorine, bromine, or iodine; and Ar stands for a phenyl group, a naphthyl group, a benzen sulfonyl group, an aminopyridine residue, an s-triazine residue, a furan residue, or a thiophene residue.

7. A negative photoresist composition as claimed in claim 1, wherein the content of said polyhalogen compound(s) as said photosensitizer based on the total amount of said polyhalogen compound(s) and said polyhydroxystyrene as said base resin is in the range of 1 mol % to 50 mol %.

8. A negative photoresist composition as claimed in claim 1, wherein said solvent is at least one compound selected from the group consisting of an ester of acetic acid, ethers, lactones, and amides.

* * * * *